(12) United States Patent
Bisplinghoff et al.

(10) Patent No.: US 10,075,186 B2
(45) Date of Patent: Sep. 11, 2018

(54) TRELLIS SEGMENT SEPARATION FOR LOW-COMPLEXITY VITERBI DECODING OF HIGH-RATE CONVOLUTIONAL CODES

(71) Applicant: Cisco Technology, Inc., San Jose, CA (US)

(72) Inventors: Andreas Bisplinghoff, Forchheim (DE); Norbert Beck, Schwabach (DE); Soeren Gehrke, Nuremberg (DE)

(73) Assignee: Cisco Technology, Inc., San Jose, CA (US)

( * ) Notice: Subject to any disclaimer, the term of this patent is extended or adjusted under 35 U.S.C. 154(b) by 106 days.

(21) Appl. No.: 14/944,674

(22) Filed: Nov. 18, 2015

(65) Prior Publication Data
US 2017/0141800 A1    May 18, 2017

(51) Int. Cl.
*H03M 13/23* (2006.01)
*H03M 13/39* (2006.01)
*H03M 13/41* (2006.01)
*H03M 13/00* (2006.01)

(52) U.S. Cl.
CPC ....... *H03M 13/23* (2013.01); *H03M 13/3961* (2013.01); *H03M 13/3988* (2013.01); *H03M 13/4107* (2013.01); *H03M 13/6502* (2013.01); *H03M 13/235* (2013.01)

(58) Field of Classification Search
CPC ............. H03M 13/3955; H03M 13/41; H03M 13/235; H03M 13/23; H03M 13/256
USPC ........................................ 714/786, 792, 795
See application file for complete search history.

(56) References Cited

U.S. PATENT DOCUMENTS

| | | | | |
|---|---|---|---|---|
| 6,505,320 B1* | 1/2003 | Turk | ................ | G11B 20/10055 341/59 |
| 6,574,773 B1* | 6/2003 | Turk | .................. | G11B 20/1426 341/59 |
| 7,848,396 B1* | 12/2010 | Wu | .................. | G11B 20/10009 375/220 |
| 8,707,145 B2* | 4/2014 | Weisman | ............ | H03M 13/413 714/762 |
| 2002/0021770 A1 | 2/2002 | Beerel et al. | | |
| 2003/0123579 A1 | 7/2003 | Safavi et al. | | |
| 2003/0226096 A1 | 12/2003 | Shen et al. | | |
| 2004/0128610 A1 | 7/2004 | Wei | | |
| 2005/0138534 A1 | 6/2005 | Nakajima et al. | | |
| 2007/0076825 A1* | 4/2007 | Graef | .................. | H03M 13/395 375/341 |

(Continued)

OTHER PUBLICATIONS

D. Kwan and S. Kallel, "A truncated best-path algorithm," in IEEE Transactions on Communications, vol. 46, No. 5, pp. 568-572, May 1998.*

(Continued)

*Primary Examiner* — Cynthia Britt
(74) *Attorney, Agent, or Firm* — Edell, Shapiro & Finnan, LLC

(57) ABSTRACT

A method for encoding bits according to a convolutional code. Bits to be encoded with the convolutional code are obtained for transmission over a communication channel. The bits are encoded according to the convolutional code with an encoder having an M-bit memory and a plurality of logic gates so as to separate trellis segments of the convolutional code into trellis sub-segments having a reduced number of branches per state than that of the trellis segments.

21 Claims, 20 Drawing Sheets

(56) References Cited

U.S. PATENT DOCUMENTS

2008/0162617 A1*  7/2008  Kuo .................. H03M 13/4107
                                                                708/408
2011/0211659 A1   9/2011  Kosakowski

OTHER PUBLICATIONS

C. Feldmann and J. H. Harris, "A constraint-length based modified Viterbi algorithm with adaptive effort," in IEEE Transactions on Communications, vol. 47, No. 11, pp. 1611-1614, Nov. 1999.*

K. Tsukano, T. Nishiya, T. Hirai and T. Nara, "Simplified EEPR Viterbi detector based on a transformed radix-4 trellis for a disk drive," in IEEE Transactions on Magnetics, vol. 35, No. 5, pp. 4387-4401, Sep. 1999.*

Sun et al., "Algorithm of Low Complexity Viterbi Decoder in Convolutional Codes", 2009 Second International Workshop on Computer Science and Engineering, Oct. 28-30, 2009, IEEE Computer Society, 4 pages.

Black et al., "A 140-Mb/s, 32-State, Radix-4 Viterbi Decoder", IEEE Journal of Solid-State Circuits, vol. 27, No. 12, Dec. 1992, 9 pages.

* cited by examiner

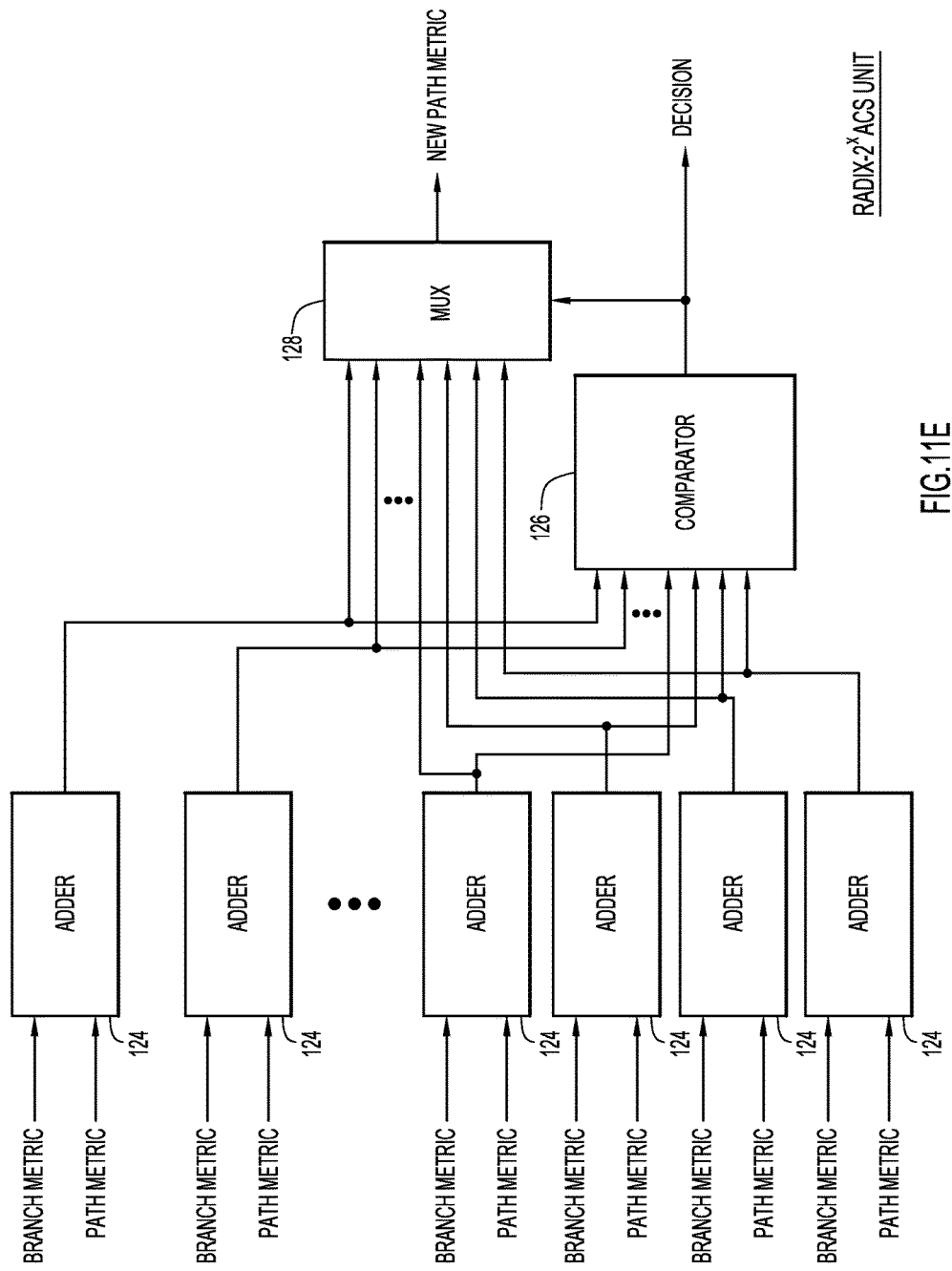

|  | | 1st Stage | 2nd Stage |
|---|---|---|---|
| BMU Complexity: | | | |
| Received Symbols per Branch: | C | = 2 | = 1 |
| Different Branch Metrics: | $2^C$ | = 4 | = 2 |
| Complexity: | $2^C \times$ ADD-C | | |
| | $= 2^C \times ((C-1) \times$ ADD-2$)$ | = 4 x ADD-2 | = 0 |
| | | = 4 x ADD-2 | = 0 |
| PMU Complexity: | | | |
| ACS-Units: | $S = 2^M$ | = 64 | = 64 |
| Inputs per ACS-Unit: | $K = 2^B$ | = 2 | = 2 |
| Complexity: | S x ACS-K | | |
| | $\approx S \times (K \times$ ADD-2 + COMP-K$)$ | = 64 x ACS-2 | = 64 x ACS-2 |
| | $\approx S \times (K \times$ ADD-2 + (K-1) x ADD-2$)$ | = 192 x ADD-2 | = 192 x ADD-2 |
| Total Complexity: | | = 388 x ADD-2 | |
| | | (Standard: 464 x ADD-2) | |

FIG.12

|  | 1st Stage | 2nd Stage | 3rd Stage | 4th Stage | 5th Stage |
|---|---|---|---|---|---|
| BMU Complexity: | | | | | |
| Received Symbols per Branch: C | = 2 | = 1 | = 1 | = 1 | = 1 |
| Different Branch Metrics: $2^C$ | = 4 | = 2 | = 2 | = 2 | = 2 |
| Complexity: $2^C \times ADD\text{-}C$ | = 4 x ADD-2 | = 0 | = 0 | = 0 | = 0 |
| $= 2^C \times ((C-1) \times ADD\text{-}2)$ | = 4 x ADD-2 | = 0 | = 0 | = 0 | = 0 |
| PMU Complexity: | | | | | |
| ACS-Units: $S = 2^M$ | = 64 | = 64 | = 64 | = 64 | = 64 |
| Inputs per ACS-Unit: $K = 2^B$ | = 2 | = 2 | = 2 | = 2 | = 2 |
| Complexity: $S \times ACS\text{-}K$ | = 64 x ACS-2 | = 64 x ACS-4 | = 64 x ACS-2 | = 64 x ACS-2 | = 64 x ACS-2 |
| $\approx S \times (K \times ADD\text{-}2 + COMP\text{-}K)$ | | | | | |
| $\approx S \times (K \times ADD\text{-}2 + (K-1) \times ADD\text{-}2)$ | = 192 x ADD-2 | = 192 x ADD-2 | = 192 x ADD-2 | = 192 x ADD-2 | = 192 x ADD-2 |
| Total Complexity: | = 1100 x ADD-2 | | | | |
| | (Standard: 4352 x ADD-2) | | | | |

FIG.13

|  | 1st Stage | 2nd Stage | 3rd Stage |
|---|---|---|---|
| BMU Complexity: | | | |
| Received Symbols per Branch: C | = 2 | = 2 | = 2 |
| Different Branch Metrics: $2^C$ | = 4 | = 4 | = 4 |
| Complexity: $2^C$ x ADD-C | = 4 x ADD-2 | = 4 x ADD-2 | = 4 x ADD-2 |
| = $2^C$ x ((C-1) x ADD-2) | = 4 x ADD-2 | = 4 x ADD-2 | = 4 x ADD-2 |
| PMU Complexity: | | | |
| ACS-Units: S = $2^M$ | = 64 | = 64 | = 64 |
| Inputs per ACS-Unit: K = $2^B$ | = 2 | = 4 | = 2 |
| Complexity: S x ACS-K | = 64 x ACS-2 | = 64 x ACS-4 | = 64 x ACS-2 |
| ≈ S x (K x ADD-2 + COMP-K) | = 192 x ADD-2 | = 448 x ADD-2 | = 448 x ADD-2 |
| ≈ S x (K x ADD-2 + (K-1) x ADD-2) | | | |
| Total Complexity: | | = 1100 x ADD-2 | |
| | | (Standard: 4352 x ADD-2) | |

FIG.14

TRELLIS SEGMENT SEPARATION FOR LOW-COMPLEXITY VITERBI DECODING OF HIGH-RATE CONVOLUTIONAL CODES

TECHNICAL FIELD

The present disclosure relates to convolutional coding for communication systems.

BACKGROUND

Complexity of Viterbi decoding of convolutional codes increases significantly for high code rates. High code rates (low redundancy) are used for certain applications, such as coherent optical communication with high spectral efficiency. Nevertheless, low complexity is needed to reduce power dissipation in coherent optical communication systems that operate at more than 100 Gbps throughput.

BRIEF DESCRIPTION OF THE DRAWINGS

FIGS. 11C, 11D and 11E are diagrams of radix-2, radix-4 and radix-$2^X$ add-compare select units of the Viterbi decoder shown in FIG. 10, according to an example embodiment.

FIG. 12 is a table depicting the complexity reduction that can be achieved in the Viterbi decoder when the encoding techniques of FIG. 2 are employed, according to an example embodiment.

FIG. 13 is a table depicting the complexity reduction that can be achieved in the Viterbi decoder when the encoding techniques of FIG. 5 are employed, according to an example embodiment.

FIG. 14 is a table depicting the complexity reduction that can be achieved in the Viterbi decoder when the encoding techniques of FIG. 7 are employed, according to an example embodiment.

DESCRIPTION OF EXAMPLE EMBODIMENTS

Overview

Figure 1:
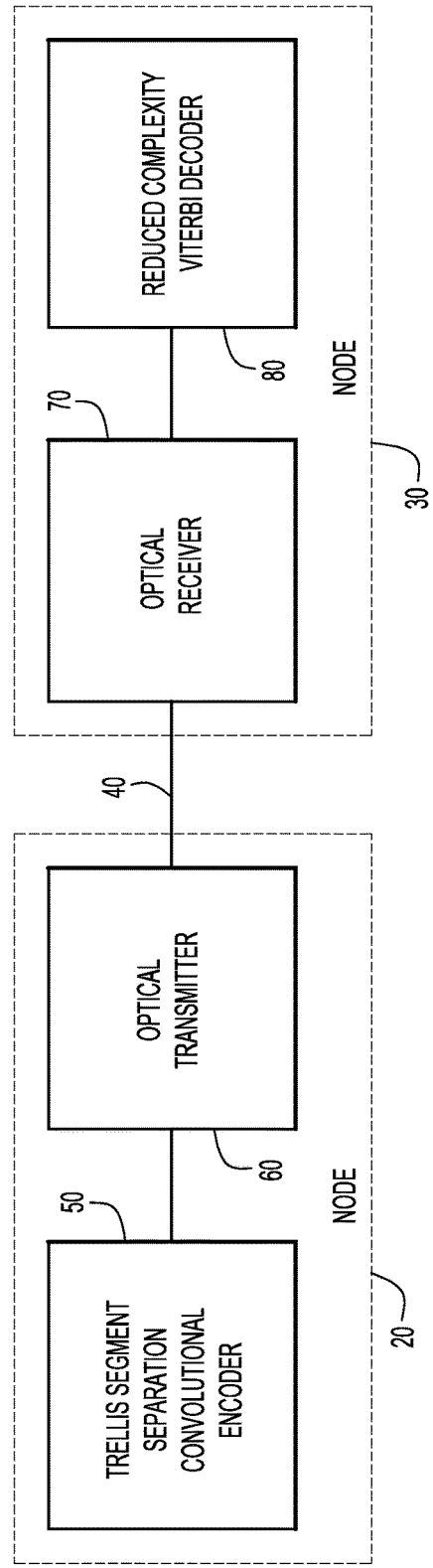
FIG. 1 is a block diagram of a communication system that includes a transmitting node and a receiving node, wherein the transmitting node includes a convolutional encoder configured to separate relatively high connected trellis segments into separate relatively sparsely connected sub-segments, which allows reduced complexity Viterbi decoding in the receiving node, according to an example embodiment.

In one embodiment, a method is provided for encoding bits according to a convolutional code. Bits to be encoded with the convolutional code are obtained for transmission over a communication channel. The bits are encoded according to the convolutional code with an encoder having an M-bit memory and a plurality of logic gates so as to separate trellis segments of the convolutional code into trellis sub-segments having a reduced number of branches per state than that of the trellis segments.

EXAMPLE EMBODIMENTS

Presented herein are techniques to encode bits with a convolutional code in order to separate trellis segments so as to reduce complexity of a decoder that decodes the encoded data. The number of trellis branches that end at a particular single state of a convolutional code defines the complexity that is needed for decoding data encoded with that convolutional code. Computational complexity scales with number of trellis branches per coded bit.

Table 1 below illustrates how the number of branches per state and per coded bit increases with coding rate.

TABLE 1

| Code Rate (R) | 1/2 | 2/3 | 3/4 | 4/5 | 5/6 | 6/7 |
|---|---|---|---|---|---|---|
| Input Bits (B) | 1 | 2 | 3 | 4 | 5 | 6 |
| Coded Bits (C) | 2 | 3 | 4 | 5 | 6 | 7 |
| Memory depth (M) | 6 | 6 | 6 | 6 | 6 | 6 |
| States (S) | 64 | 64 | 64 | 64 | 64 | 64 |
| Branches per State (K) | 2 | 4 | 8 | 16 | 32 | 64 |
| Branches per Segment (K · S) | 128 | 256 | 512 | 1024 | 2048 | 4096 |
| Branches per Coded Bit (K · S/C) | 64 | 85.3 | 128 | 204.8 | 341.3 | 585.1 |

Table 1 reveals that the number of branches per state (K) for Rate=1/2 is two (2), for R=2/3 is four (4), for R=3/4 is eight (8), for R=4/5 is 16, for R=5/6 is 32 and for R=6/7 is 64. Assuming code memory M=6, as an example, this translates for Rate=1/2 into 64 branches per coded bit, for Rate=2/3 into 85.3 branches per coded bit, for Rate=3/4 into 128 branches per coded bit, for Rate=4/5 into 204.8 branches per coded bit, for Rate=5/6 into 341.3 branches per coded bit, and Rate=6/7 into 585.1 branches per coded bit. Thus, in order to simplify Viterbi decoding of a convolutional code, the simplified trellis should have less than K·S/C branches per coded bit. This means that for M=6 as an example and R=2/3, the number of branches per coded bit should be less than 85.3, for R=3/4, the number of branches per coded bit should be less than 128, for R=4/5, the number of branches per coded bit should be less than 204.8, and so on.

Accordingly, highly connected trellis segments in the convolutional code are converted into trellis segments with reduced connections. These reduced connectivity trellis segments are referred to as trellis sub-segments. Depending on certain constraints on the code taps at the encoder, a single (highly connected/high radix) trellis segment can be separated into several (sparsely connected/low radix) sub-segments. Examples of low radix sub-segments are radix-2 and radix-4 sub-segments. The term "radix" in this context refers to the number of branches that end in a given state, and thus "radix-2" means that 2 branches end in a given state and radix-4 means that 4 branches end in a given state.

The principal components of a Viterbi decoder are a branch metric unit, path metric unit (that includes add-compare-select digital logic circuits) and a traceback unit. In designing state of art Viterbi decoding, it is desirable to reduce the complexity of the branch metric unit and path metric unit by reducing the number of digital logic circuits needed for the Viterbi decoding computations.

Significant complexity reduction in the branch metric unit and the path metric unit of the Viterbi decoder for higher code rates can be achieved with the sparsely connectivity trellis sub-segments, with negligible performance penalty. As will become apparent from the following description, the coding scheme and encoders described herein produce an encoded bit stream that, after it is transmitted, allows for reduced complexity of a Viterbi decoder on a receive side of a communication channel.

Reference is first made to FIG. 1. FIG. 1 shows a block diagram of a coherent optical communication system 10. The system 10 includes a transmitting node 20 and a receiving node 30. Node 20 is transmitting data over optical fiber 40 to be received by node 30. Node 20 includes a trellis segment separation convolutional encoder 50 and an optical transmitter 60. Several forms of the trellis segment separation convolutional encoder 50 are presented herein. Node 60 includes an optical receiver 70 and a reduced complexity Viterbi decoder 80. While FIG. 1 illustrates an optical communication system, this is only an example, and the convolutional code trellis segment separation techniques may be employed for other communication applications.

Figure 2:
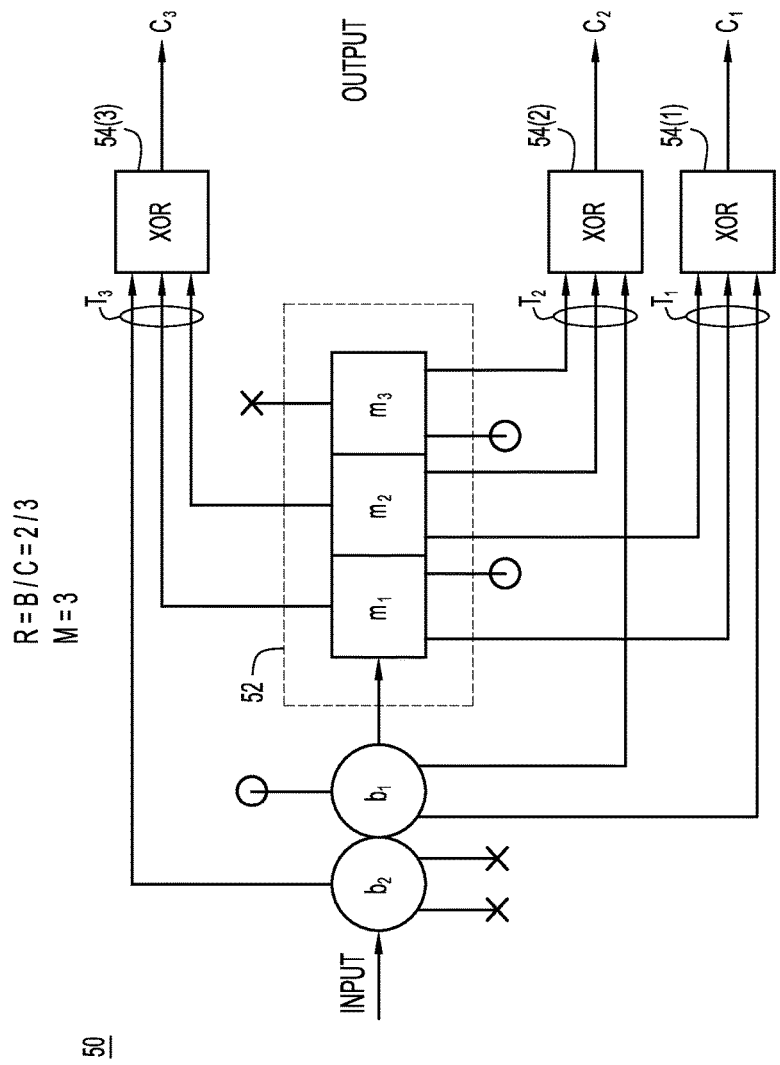
FIG. 2 is a block diagram of a convolutional encoder configured for trellis segment separation, according to an example embodiment.

Turning now to FIG. 2, a first form of the trellis segment separation convolutional encoder 50 is shown. In this example, the encoder 50 is configured for a code rate R=2/3 convolutional code where the memory depth (number of memory cells M) is 3. (It is noted that in this example M=3 as opposed to M=6 mentioned in Table 1, but this is for simplicity only. Other examples where M=6 are presented hereinafter.) Rate 2/3 indicates that there are two input bits and 3 output/coded bits. Specifically, the encoder 50 includes a memory 52 with three bits $m_1$, $m_2$ and $m_3$ and three XOR gates 54(1)-54(3) each with three inputs (as an arbitrary example) and one output. The inputs to the encoder 50 are bits $b_1$ and $b_2$ and the outputs of the encoder 50 are coded bits $c_1$, $c_2$ and $c_3$.

The encoder 50 in FIG. 2 is configured to generate a radix-2 separable convolutional code (code 2/3), and in so doing, a new intermediate state is introduced. "Radix" denotes how many branches end in a given state, and thus "radix-2" means that 2 branches end in a given state.

Instead of applying input bits $b_1$ and $b_2$ together as input to the encoder 50, only $b_1$ of the bits $b_1$ and $b_2$ are input to the encoder to compute $c_1$ and $c_2$. In an intermediate state, $b_2$ is input into the encoder to compute $c_3$. The "X's" in FIG. 2 denote that when $b_1$ is input to the encoder, $b_2$ is not available for encoding and therefore not connected to XOR gates 54(1) and 54(2) and when $b_2$ is input to the encoder nothing is output from bit position $m_3$ of the memory 42 to XOR gate 54(3), which computes $c_3$. This puts certain constraints on the code taps $T_1$, $T_2$ and $T_3$ of the encoder. Selecting the code taps in a particular manner allows for separating of the trellis segments into more sparsely connected sub-segments and in so doing creating an intermediate state.

The code taps $T_1$, $T_2$ and $T_3$ for the M=3 example of FIG. 2 are listed in Table 2 below.

TABLE 2

|       | $m_3$ | $m_2$ | $m_1$ | $b_1$ | $b_2$ |
|-------|-------|-------|-------|-------|-------|
| $T_1 =$ | 0 | 1 | 1 | 1 | 0 |
| $T_2 =$ | 1 | 1 | 0 | 1 | 0 |
| $T_3 =$ | 0 | 1 | 1 | 0 | 1 |

Figure 3:
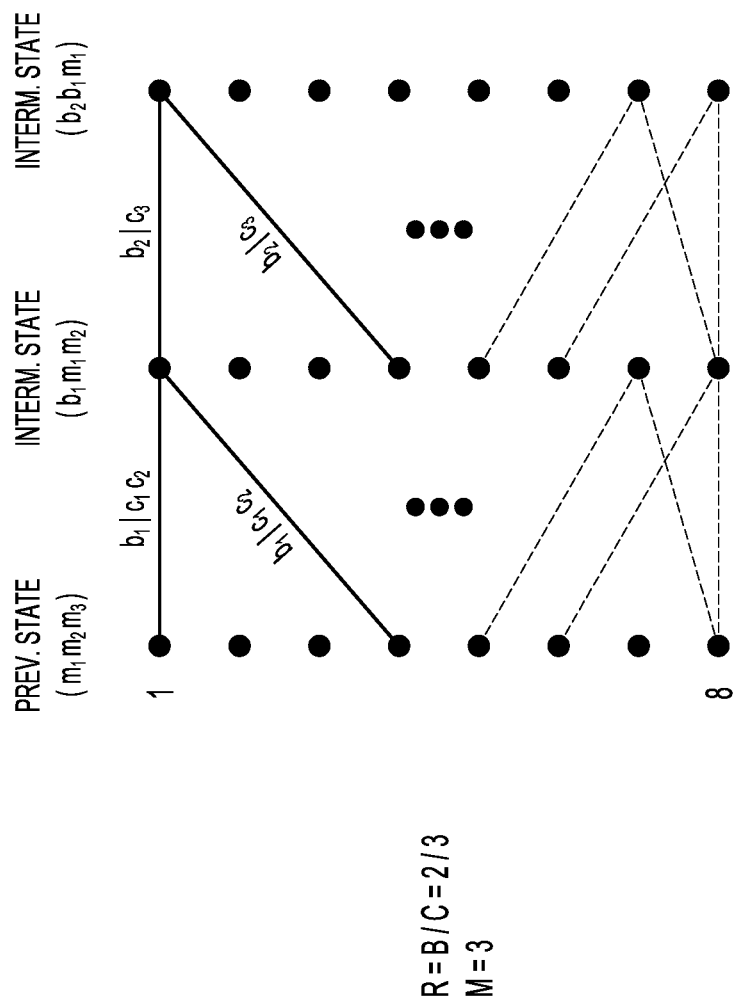
FIG. 3 is a trellis state diagram illustrating the creation of an intermediate state with radix-2 connectivity by the convolutional encoder depicted in FIG. 2, according to an example embodiment.

FIG. 3 illustrates the intermediate state that is created for the encoder depicted in FIG. 2 using the fact that code taps of Table 2 are zero in $T_1$ and $T_2$ at position $b_2$ and in $T_3$ at position $m_3$. The intermediate state is, in one example, created for $(b_1 m_2 m_2)$ between a previous state $(m_1 m_2 m_3)$ and a next state $(b_2 b_1 m_1)$. Each intermediate state can be reached by two branches, as shown in FIG. 3.

In another example, a radix-2 separable (rate 2/3) convolutional code can similarly be achieved with a memory having a depth of 6 (M=6). The constraints on the code taps for an encoder with a memory of depth 6 (M=6) are listed in Table 3 (where "x" in the table indicates that the value could be logic "1" or "0" but an "0" in the table indicates the value must be logic "0").

TABLE 3

|       | $m_6$ | $m_5$ | $m_4$ | $m_3$ | $m_2$ | $m_1$ | $b_1$ | $b_2$ |
|-------|-------|-------|-------|-------|-------|-------|-------|-------|
| $T_1 =$ | x | x | x | x | x | x | x | 0 |
| $T_2 =$ | x | x | x | x | x | x | x | 0 |
| $T_3 =$ | 0 | x | x | x | x | x | x | x |

As shown in Table 1, an R=2/3 code (where M=6) would have K=4 branches per state. However, by using constraints on the code taps as shown in Table 3, two trellis sub-segments are produced in which each state has not more than 2 branches (i.e., a trellis with only radix-2 sub-segments).

Figure 4:
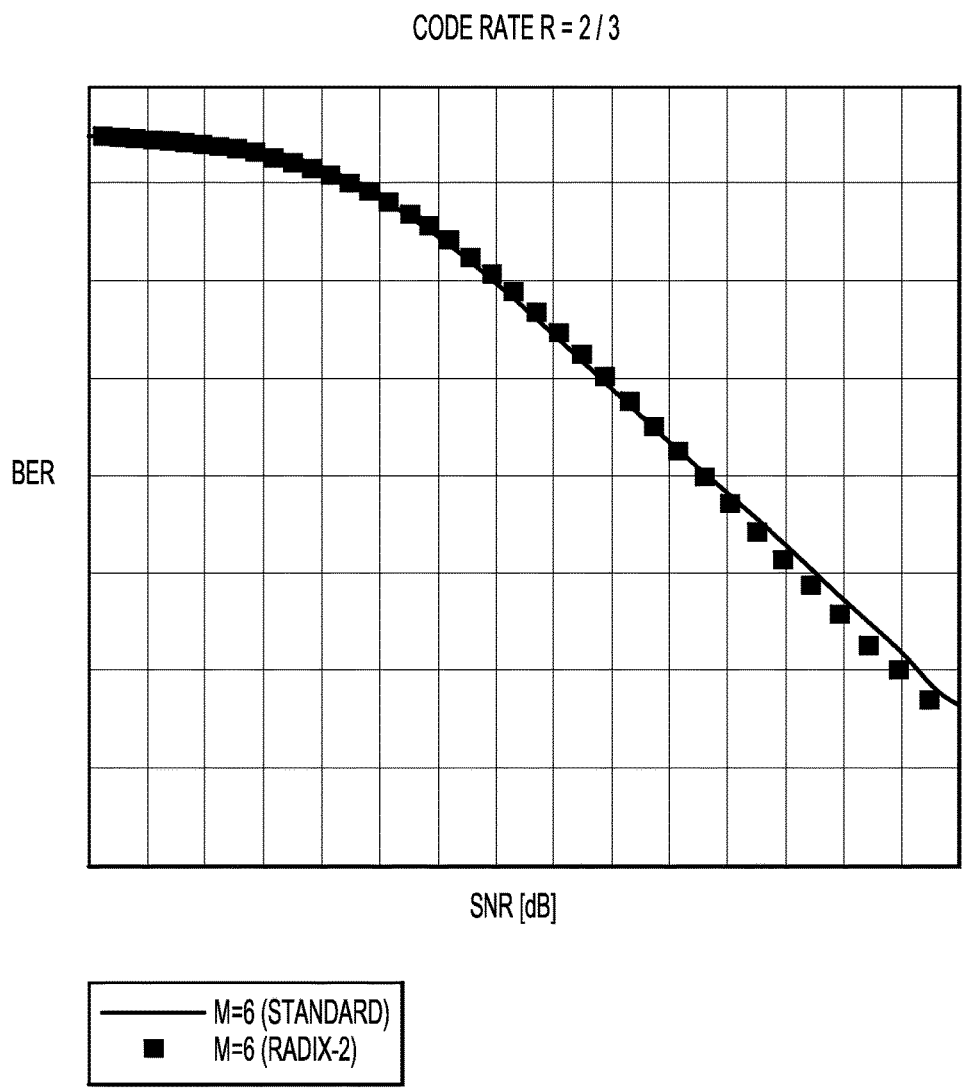
FIG. 4 is a diagram illustrating bit error rate versus signal-to-noise ratio plots for the convolutional code with sparsely connected trellis sub-segments as depicted in FIG. 3 compared with a conventional convolutional code with high connectivity trellis segments.

FIG. 4 illustrates a plot comparing bit error rate (BER) versus signal-to-noise ratio (SNR) performance for an radix-2 code that uses the techniques depicted in FIG. 3 (for M=6) and for a conventional convolutional code. As indicated in the plots of FIG. 4, the performance of the radix-2 code is nearly the same as for a conventional code.

Figure 5:
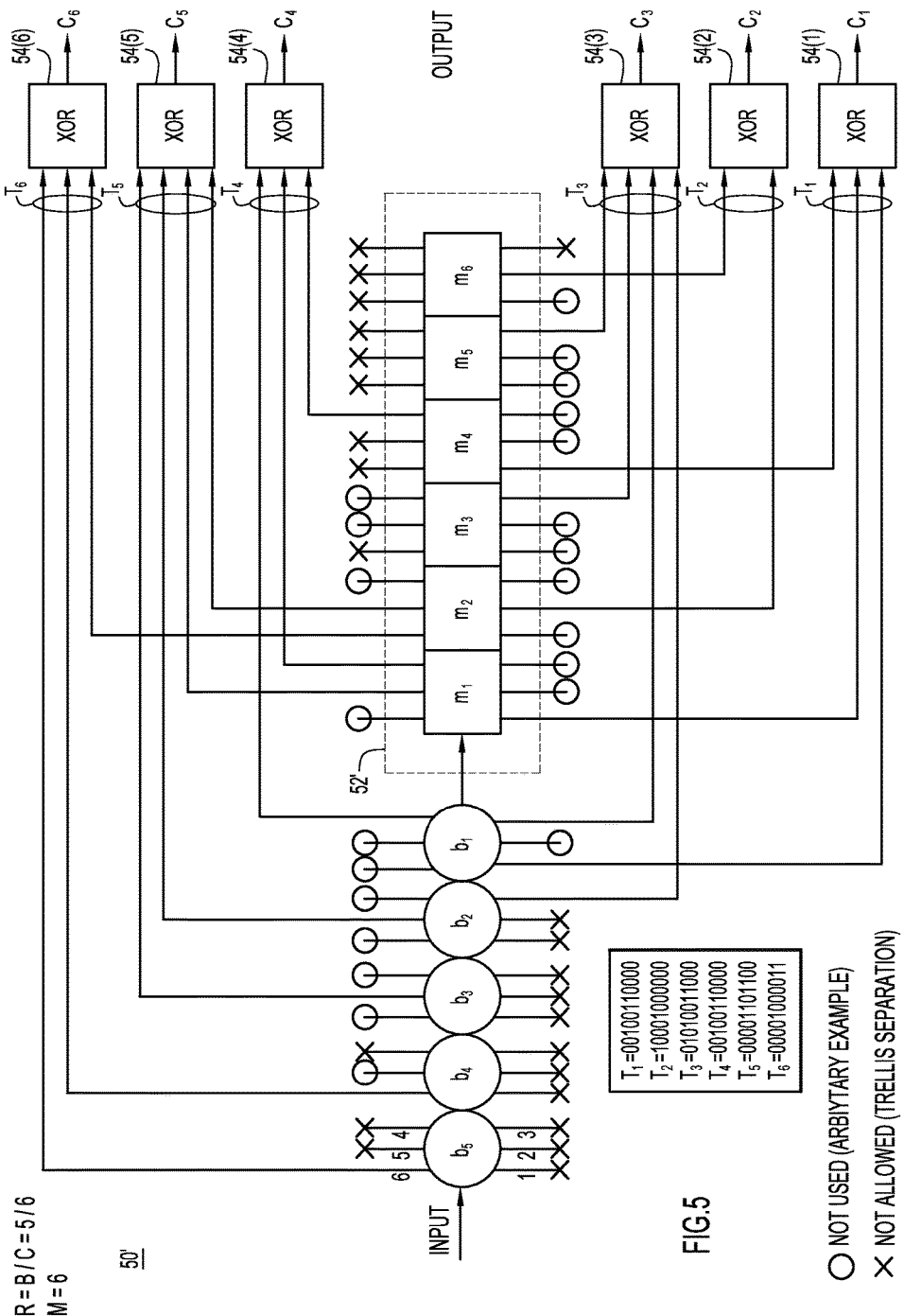
FIG. 5 is a block diagram of a convolutional encoder configured for trellis segment separation, according to another example embodiment.
Figure 6:
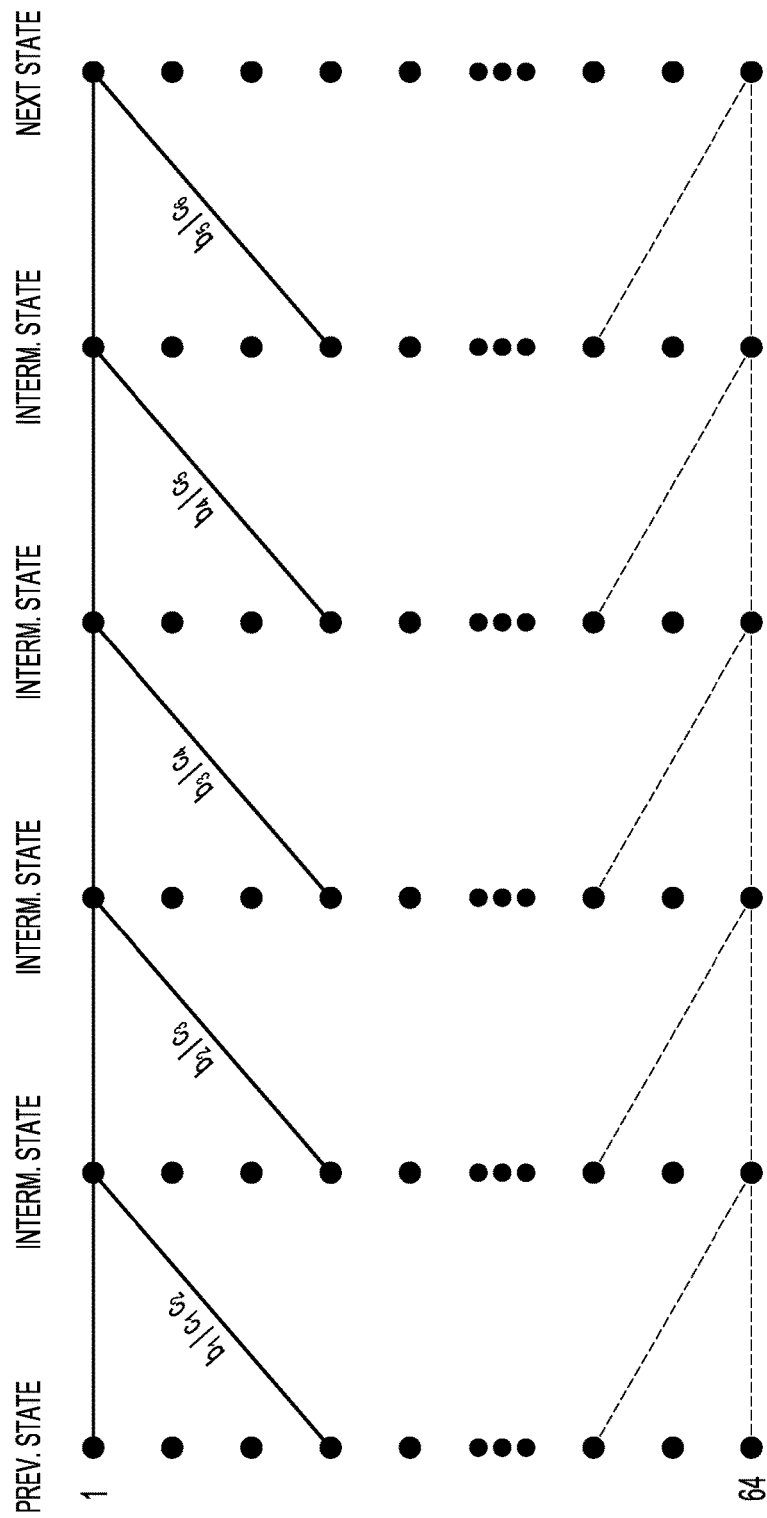
FIG. 6 is a trellis state diagram illustrating the creation of multiple intermediate states with radix-2 connectivity by the convolutional encoder depicted in FIG. 5, according to an example embodiment.

Reference is now made to FIGS. 5 and 6. FIG. 5 shows a diagram of an encoder 50' that is similar to encoder 50 shown in FIG. 3, but is configured for an R=5/6 convolutional code. Encoder 50' includes a 6-bit memory 52' and 6 XOR gates 54(1)-54(6). Encoder 50' has five input bits $b_1$-$b_5$ and the memory 52' has 6 bits, $m_1$-$m_6$. Each XOR gate has two, three, or four inputs (as an arbitrary example) and one output. The outputs of the encoder 50' are coded bits $c_1$, $c_2$, $c_3$, $c_4$, $c_5$, and $c_6$. The encoder 50' is configured to generate a radix-2 separate convolutional code (code 5/6) such that multiple radix-2 intermediate states are introduced.

FIG. 6 illustrates a trellis segment transition diagram for the encoder 50' shown in FIG. 5. In this example, for a rate 5/6 convolutional code, there are multiple intermediate states, each with only 2 branches ending in each state. If trellis segment separation were not used as is the case for a conventional convolutional code, the number of branches per state is 32 for an R=5/6 code, as indicated in Table 1. With trellis segment separation the effective number of branches per state is 10 (five sub-segments times two branches per state).

The constraints on the code taps for rate 5/6 for the encoder 50' shown in FIG. 5, are listed in Table 4 below.

TABLE 4

|  | $m_6$ | $m_5$ | $m_4$ | $m_3$ | $m_2$ | $m_1$ | $b_1$ | $b_2$ | $b_3$ | $b_4$ | $b_5$ |
|---|---|---|---|---|---|---|---|---|---|---|---|
| $T_1 =$ | x | x | x | x | x | x | x | 0 | 0 | 0 | 0 |
| $T_2 =$ | x | x | x | x | x | x | x | 0 | 0 | 0 | 0 |
| $T_3 =$ | 0 | x | x | x | x | x | x | x | 0 | 0 | 0 |
| $T_4 =$ | 0 | 0 | x | x | x | x | x | x | x | 0 | 0 |
| $T_5 =$ | 0 | 0 | 0 | x | x | x | x | x | x | x | 0 |
| $T_6 =$ | 0 | 0 | 0 | 0 | x | x | x | x | x | x | x |

Figure 7:
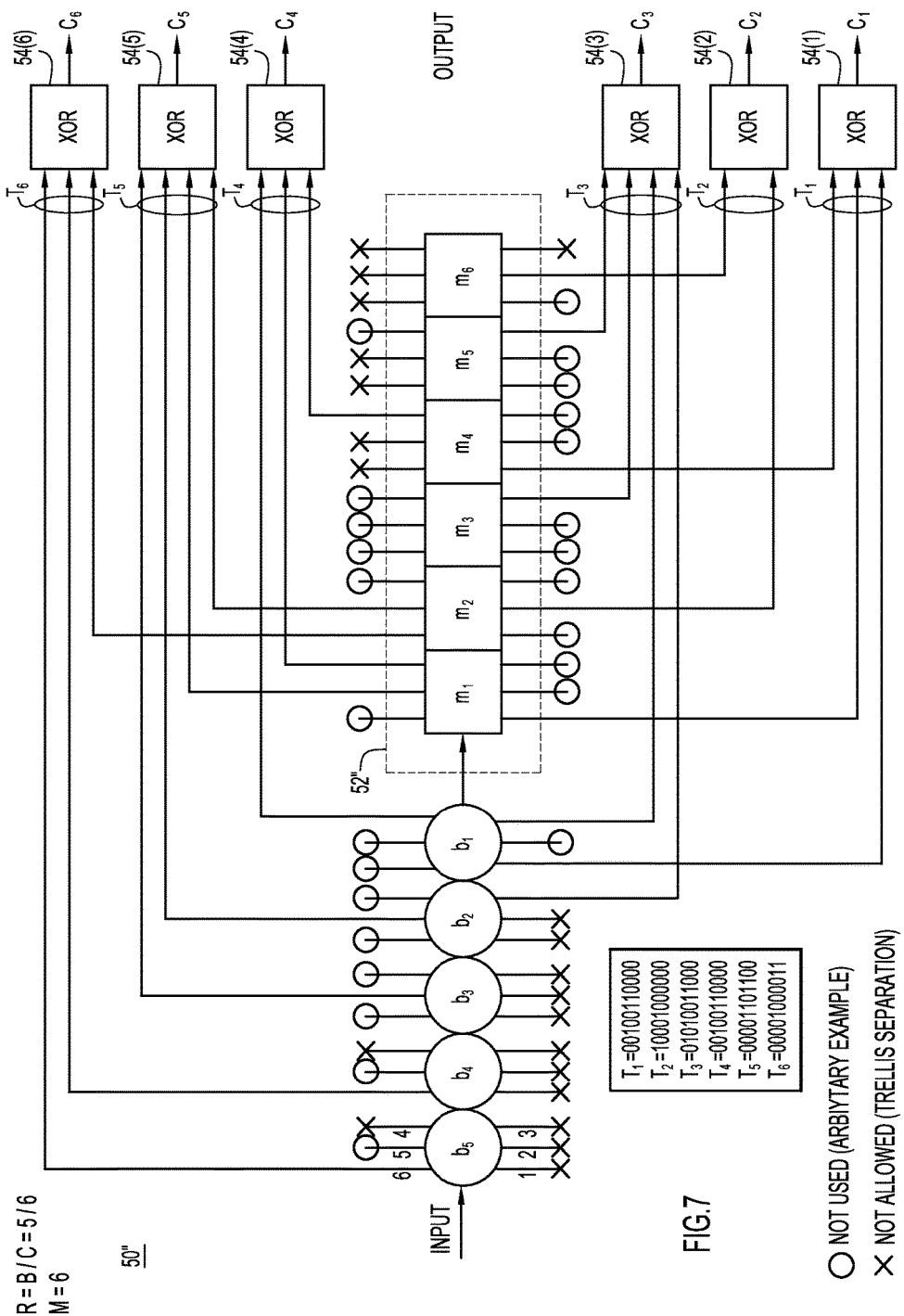
FIG. 7 is a block diagram of a convolutional encoder configured for combination/mix of radix-2 and radix-4 trellis segment separation, according to another example embodiment.
Figure 8:
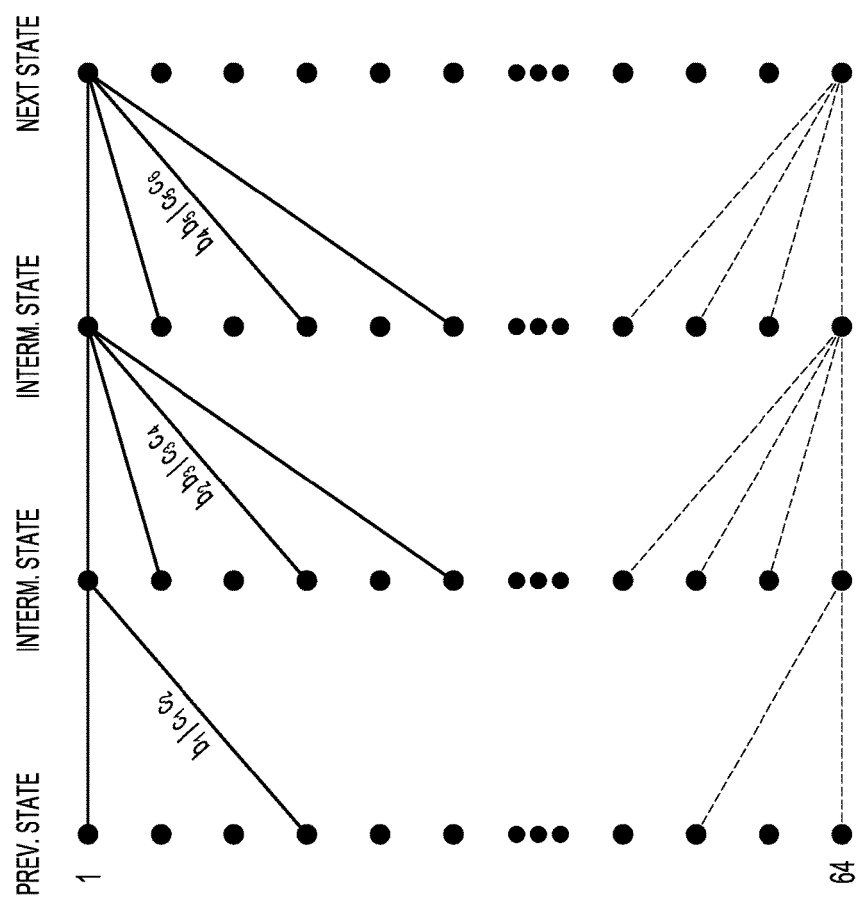
FIG. 8 is a trellis state diagram illustrating the creation of a combination/mix of radix-2 and radix-4 intermediate states by the convolutional encoder depicted in FIG. 7A, according to an example embodiment.

Reference is now made to FIGS. 7 and 8. FIG. 7 shows a diagram of an encoder 50" that is similar to encoder 50' shown in FIG. 5, but is configured to have a combination or mix of some radix-2 sub-segments and some radix-4 sub-segments. Encoder 50" includes a 6-bit memory 52" and 6 XOR gates 54(1)-54(6).

FIG. 8 illustrates a trellis segment transition diagram for the variation of the encoder shown in FIG. 7, which is configured to have a combination or mix of some radix-2 sub-segments and some radix-4 sub-segments for a rate 5/6 convolutional code. This is also referred to as a split radix approach. It allows for greater freedom in optimizing the code taps compared to the single radix-2 approach shown in FIG. 6.

The constraints on the code taps for the split radix approach depicted in FIGS. 7 and 8 are listed below in Table 5 below.

TABLE 5

|  | $m_6$ | $m_5$ | $m_4$ | $m_3$ | $m_2$ | $m_1$ | $b_1$ | $b_2$ | $b_3$ | $b_4$ | $b_5$ |
|---|---|---|---|---|---|---|---|---|---|---|---|
| $T_1 =$ | x | x | x | x | x | x | x | 0 | 0 | 0 | 0 |
| $T_2 =$ | x | x | x | x | x | x | x | 0 | 0 | 0 | 0 |
| $T_3 =$ | 0 | x | x | x | x | x | x | x | 0 | 0 | 0 |
| $T_4 =$ | 0 | x | x | x | x | x | x | x | 0 | 0 | 0 |
| $T_5 =$ | 0 | 0 | 0 | x | x | x | x | x | x | x | x |
| $T_6 =$ | 0 | 0 | 0 | x | x | x | x | x | x | x | x |

Comparing the approaches of FIGS. 6 and 8, the approach of FIG. 6 has more intermediate states than the approach of FIG. 8. Viterbi decoding takes more time for the computations of the intermediate states for the approach of FIG. 6 since there are more intermediate states. In addition, the approach of FIG. 6 requires storage of more data since there are more intermediate states than the approach of FIG. 8.

Figure 9:
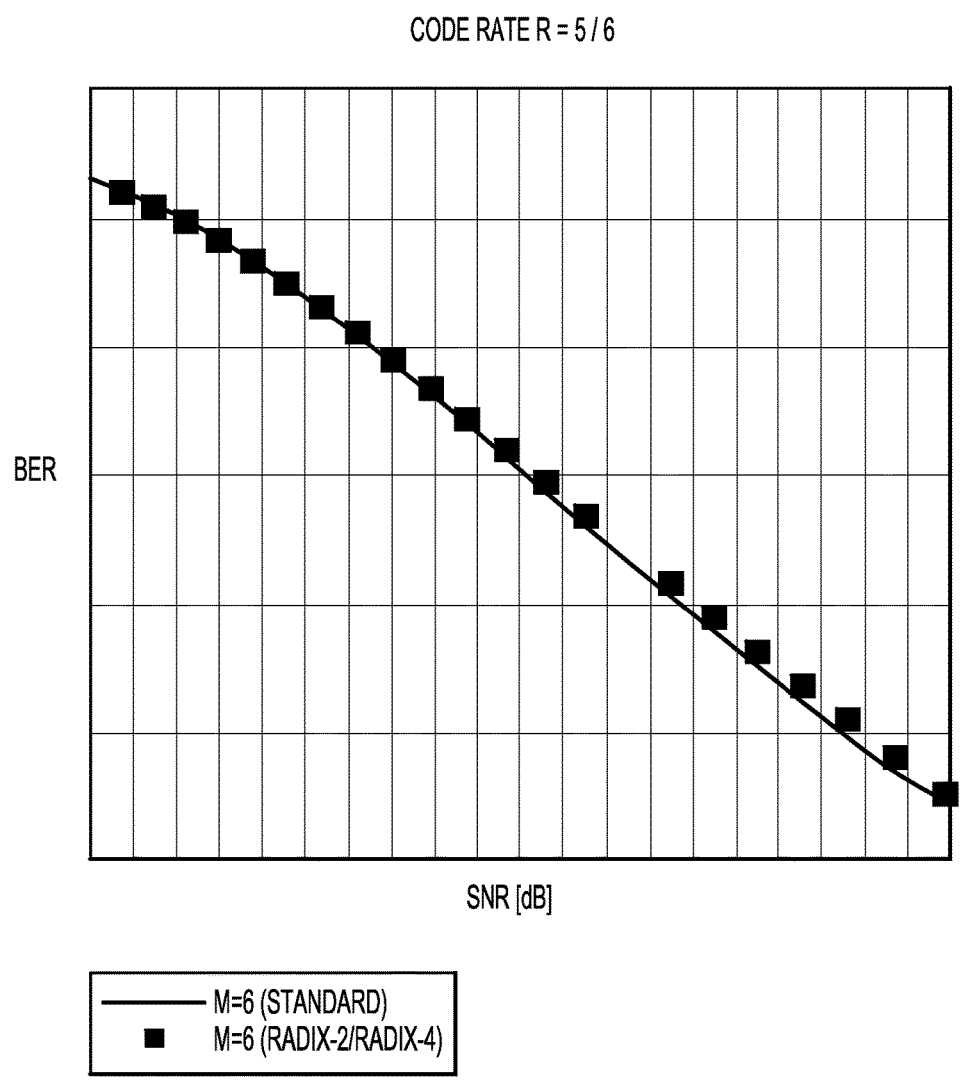
FIG. 9 is a diagram illustrating bit error rate versus signal-to-noise ratio plots for the radix-2 and radix-4 intermediate states convolutional code depicted in FIG. 7B compared with a conventional convolutional code.

FIG. 9 illustrates plots comparing the performance of the split radix approach of FIG. 8 with a conventional convolutional encoder approach for R=5/6 and M=6. As is evident from this diagram, the performance of the split radix trellis segment approach is nearly the same as the standard approach.

Figure 10:
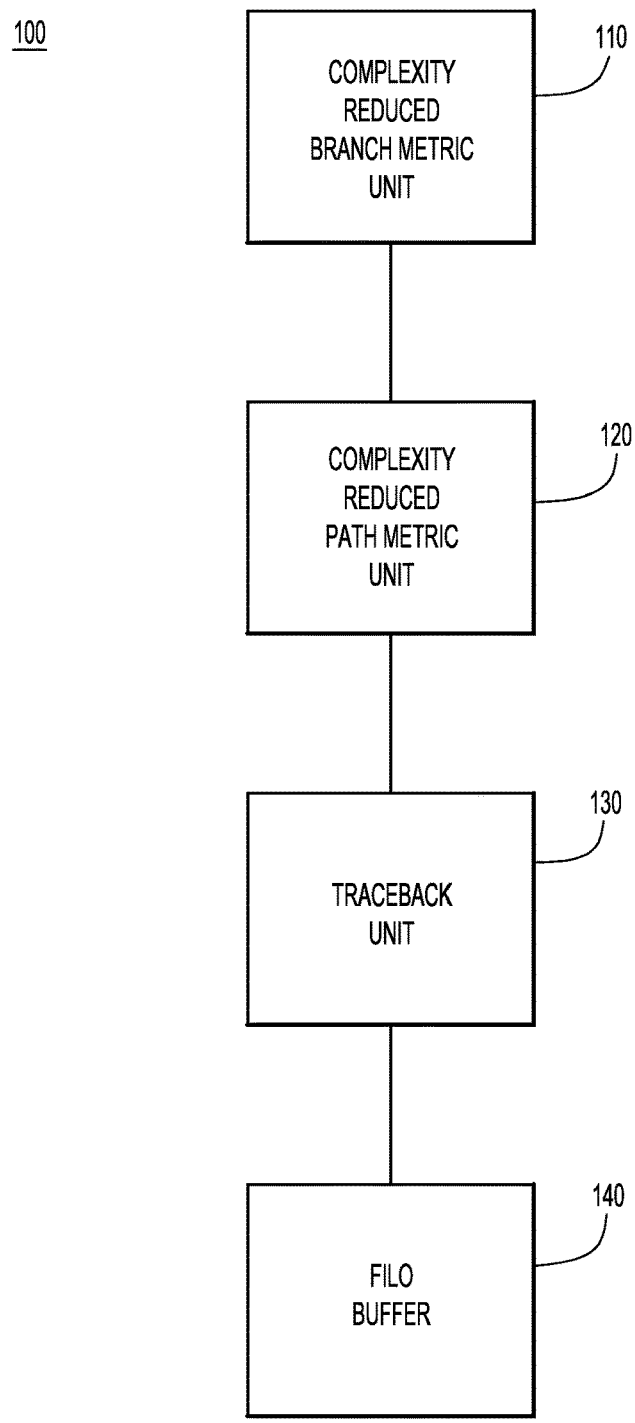
FIG. 10 is a block diagram of a Viterbi decoder, according to an example embodiment.

FIG. 10 is a block diagram of a Viterbi decoder according to an example embodiment. The Viterbi decoder 100 includes a complexity reduced branch metric unit 110, a complexity reduced path metric unit 120, a traceback unit 130 and a first-in last-out (FILO) buffer 140. The complexity reduced branch metric unit 110 receives the coded bitstream and outputs branch metrics. The complexity reduced path metric unit 120 generates path metric decisions based on the branch metrics. The traceback unit 130 outputs traceback decisions and the FILO buffer 140 outputs a decoded bitstream.

When the trellis segment separation approaches presented above in connection with FIGS. 2-9 are employed, the complexity reduced branch metric unit 110 and complexity reduced path metric unit 120 may be designed as now described.

Figure 11A:
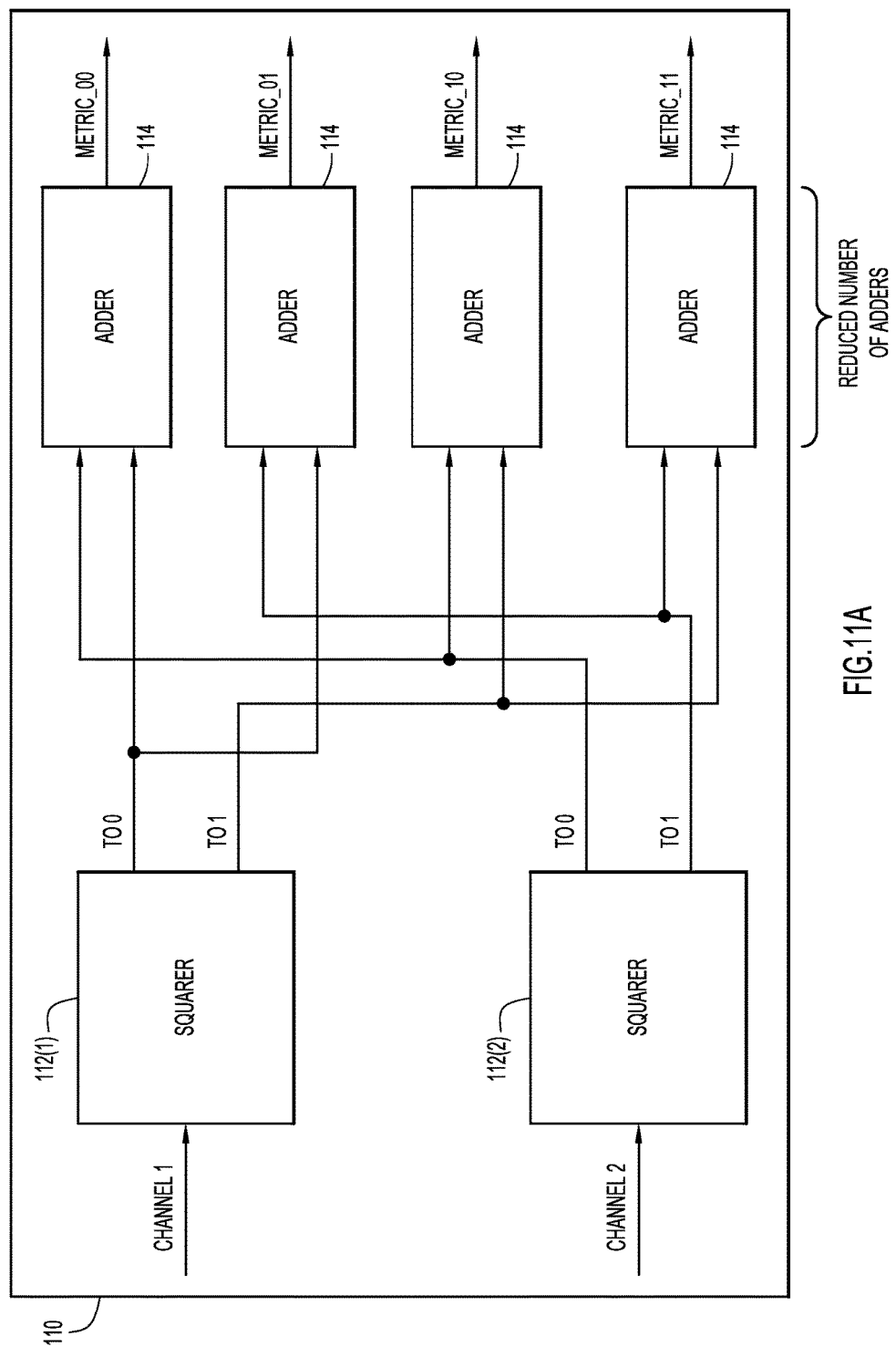
FIG. 11A is a block diagram of a complexity reduced branch metric unit of the Viterbi decoder shown in FIG. 10, according to an example embodiment.

FIG. 11A illustrates a simplified diagram of the complexity reduced branch metric unit 110 with two input channels as an example. The complexity reduced branch metric unit 110 includes, squarer blocks 112(1) and 112(2) (or similar computational block), for computation of squared Euclidean distances, and a plurality of adders 114 that add combinations of the outputs of the squarer blocks 112(1) and 112(2). FIG. 11A is simplified diagram of a branch metric unit for a conventional rate 1/2 convolutional code. The number of squarer blocks scales linearly with the amount of coded bits per trellis segment and the number of adders scales exponentially with the amount of coded bits per trellis segment. Nevertheless, as will be explained below, for higher rate decoders the number of adders 114 is greatly reduced when the trellis segment separation approaches are employed at the encoder side.

Figure 11B:
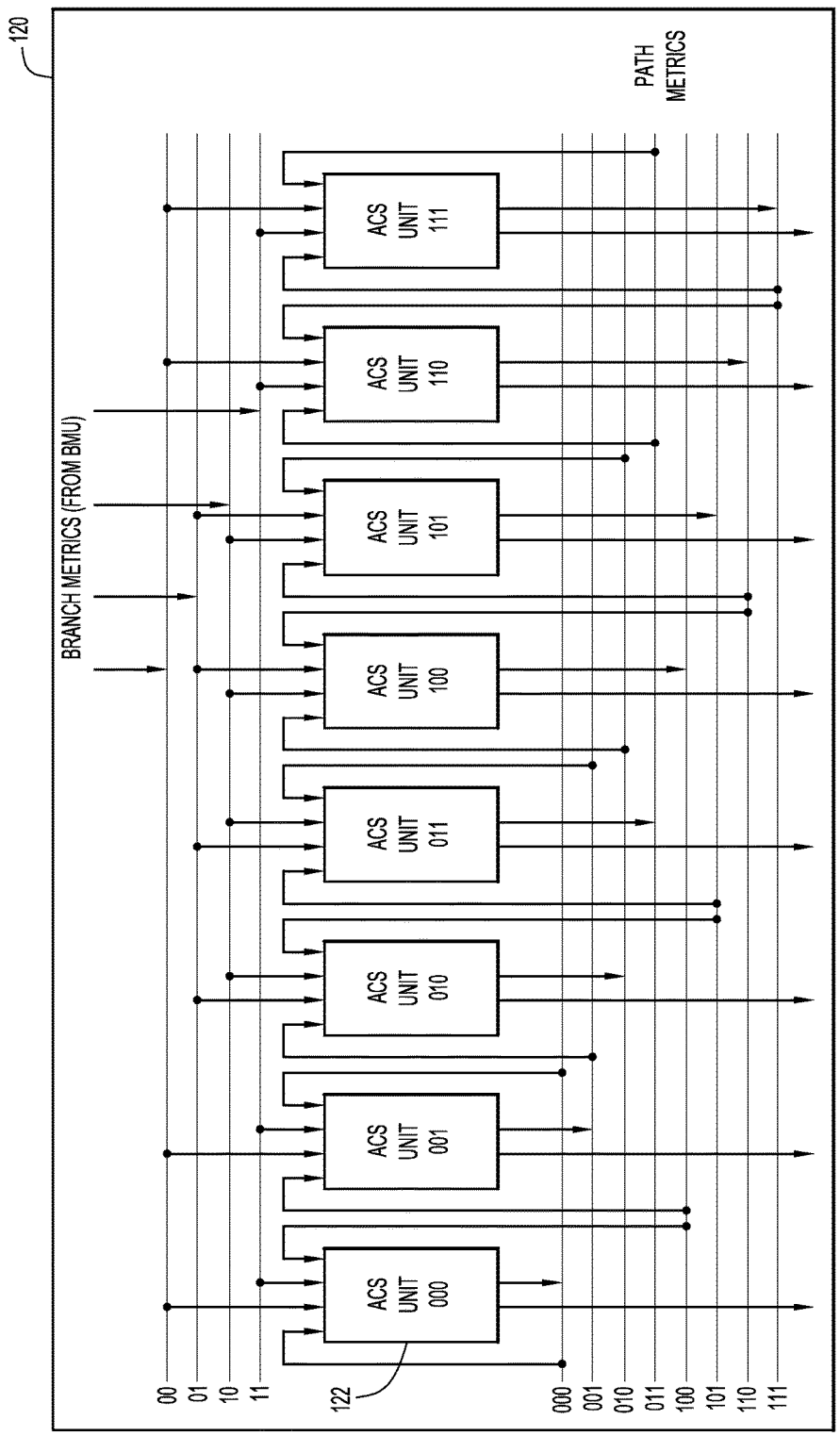
FIG. 11B is a diagram of the path metric unit with radix-2 add-compare select units of the Viterbi decoder shown in FIG. 10, according to an example embodiment.

FIG. 11B illustrates a block diagram of a complexity reduced path metric unit 120 with a plurality ($2^M$) of radix-2 add-compare-select (ACS) units 122. This complexity reduced path metric unit 120 with radix-2 ACS units 122 can be used for higher rate convolutional codes when the trellis segment separation techniques presented above are employed at the encoder site.

Figure 11C:
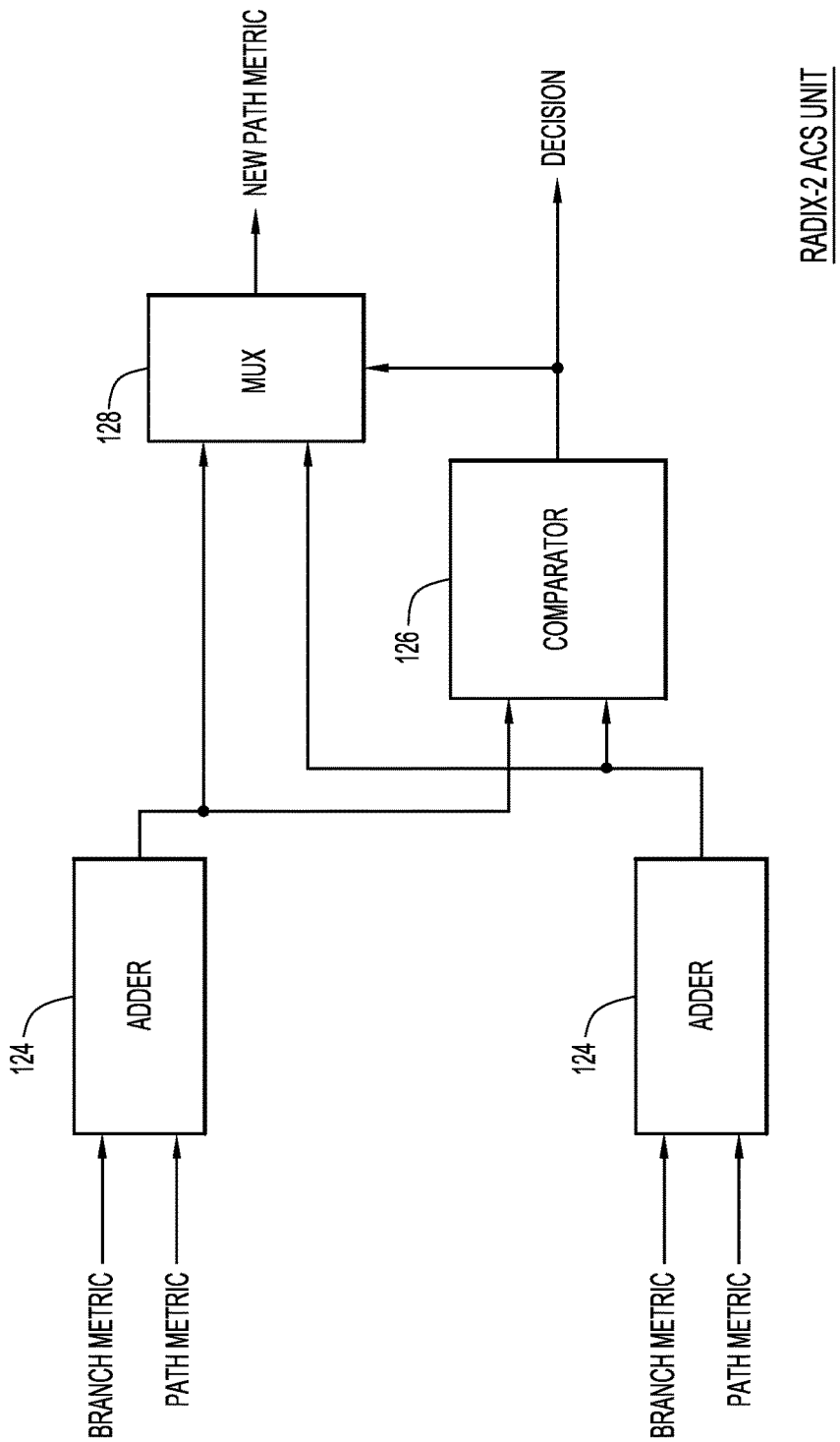

FIG. 11C illustrates an example block diagram of a radix-2 ACS unit 122. Each ACS unit 122 includes two adders 124, a comparator 126 with two inputs and a multiplexer 128.

Figure 11D:
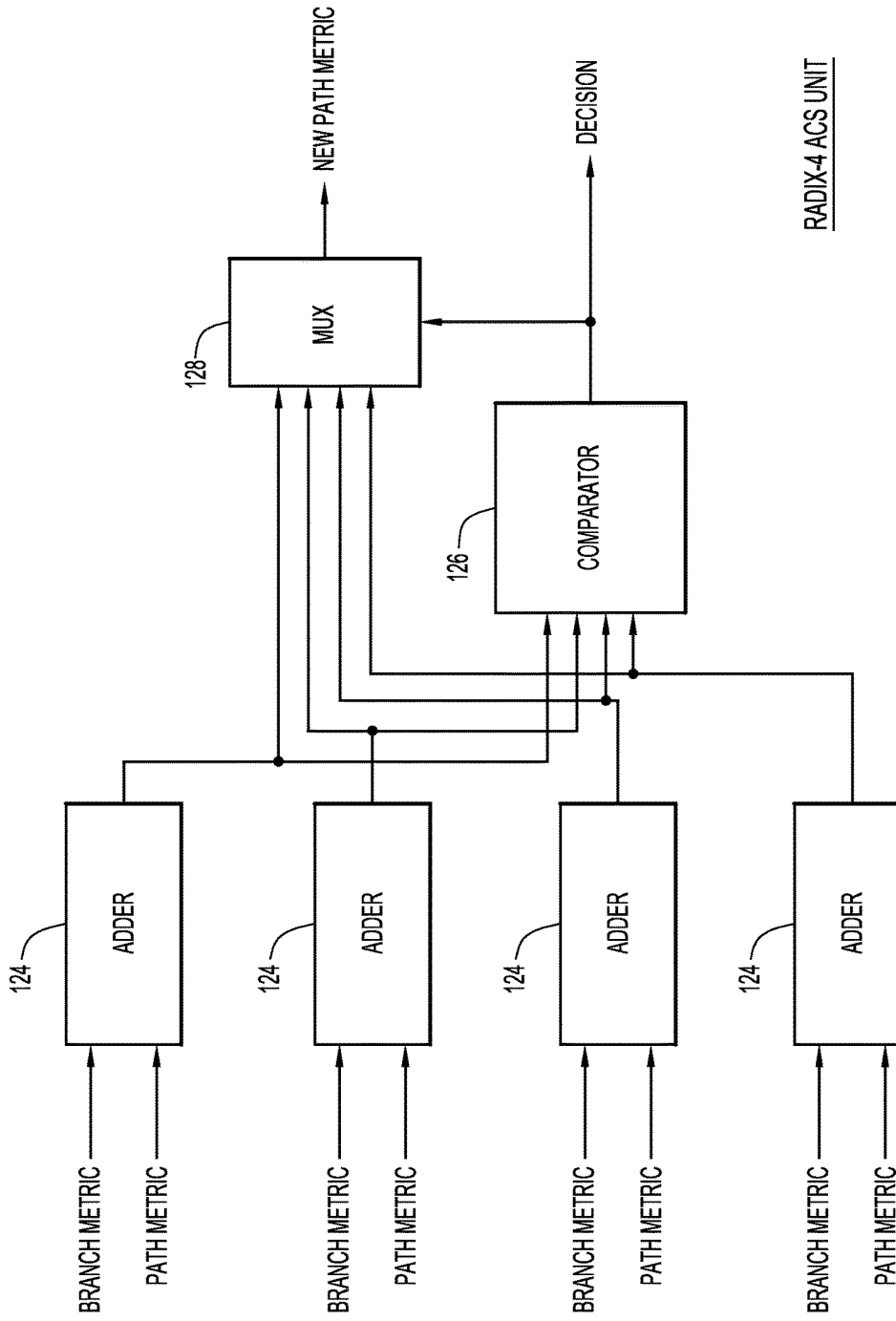

FIG. 11D illustrates an example block diagram of a radix-4 ACS unit 122. Each ACS unit 122 includes four adders 124, a comparator 126 with four inputs and a multiplexer 128.

FIG. 11E illustrates an example block diagram of a radix-$2^X$ ACS unit 122. Each ACS unit 122 includes $2^X$ adders 124, a comparator 126 with $2^X$ inputs and a multiplexer 128.

Complexity of radix-$2^X$ ACS units increases exponentially with N. Thus, by reducing the radix of ACS units needed in the complexity reduced path metric unit 120, the numbers of adders, comparator and multiplexer inputs are reduced.

Specifically, for the radix-2 separable convolutional code (rate 2/3) produced by the encoder depicted in FIGS. 2 and 3, the total complexity is reduced as depicted in FIG. 12. To summarize, the total complexity for the branch metric unit and path metric unit is 388 Add-2 adders as compared to 464 Add-2 adders for a conventional approach.

FIG. 13 illustrates similar data for the radix-2 approach shown in FIG. 6. To summarize, the total complexity for the branch metric unit and path metric unit is 964 Add-2 adders as compared to 4532 Add-2 adders for a conventional approach. When the trellis segments are separated into only radix-2 sub-segments, the greatest computational complexity savings can be achieved at the decoder.

FIG. 14 illustrates similar data for the split radix-2/radix-4 approach shown in FIG. 8. To summarize, the total complexity for the branch metric unit and path metric unit is 1100 Add-2 adders as compared to 4532 Add-2 adders for a conventional approach. This mix or split radix approach involves a trade-off between computational complexity savings and increase in latency and hence additional buffering of received signals.

Table 6 below illustrates a complexity comparison between standard Viterbi decoders and a Viterbi decoder that can be designed when the techniques presented herein are employed.

TABLE 6

| | Code | | | | |
|---|---|---|---|---|---|
| | 2/3 (standard) | 2/3 (radix-2) | 5/6 (standard) | 5/6 (radix-2) | 5/6 (radix-2/ radix-4) |
| Input Bits (B) | 2 | 2 | 5 | 5 | 5 |
| Coded Bits (C) | 3 | 3 | 6 | 6 | 6 |
| Memory Depth (M) | 6 | 6 | 6 | 6 | 6 |
| States (S) | 64 | 64 | 64 | 64 | 64 |
| Branches per State (K) | 4 | n/a | 32 | n/a | n/a |
| BMU Complexity (ADD-2) | 16 | 4 | 320 | 4 | 12 |
| PMU Complexity (ADD-2) | 448 | 384 | 4032 | 960 | 1088 |
| Total Complexity (ADD-2) | 464 | 388 | 4352 | 964 | 1100 |
| Complexity per Coded Bit (ADD-2) | 154.7 | 129.3 | 725.3 | 160.7 | 183.3 |

Table 6 reveals that for a rate 2/3 convolutional code, a Viterbi decoder that can be used when the radix-2 techniques presented herein are employed has a complexity per code bit of 129.3 and a conventional Viterbi decoder has a complexity per coded bit of 154.7. This is a complexity reduction of 16%. The complexity reduction is more substantial for a rate 5/6 convolutional code. Specifically, a conventional Viterbi decoder has a complexity per coded bit of 725.3, whereas when the radix-2 techniques presented herein are employed, the Viterbi decoder has a complexity of 160.7 (a reduction of 78%) and when the radix-2/radix-4 techniques are employed, the Viterbi decoder has a complexity of 183.3 (a reduction of 75%).

Table 7 below lists rules for code tap constraints of a radix-2 encoder for a rate (R) convolutional code where R=B/(B+1), and B is the number of input bits, C is the number of coded bits (C=B+1) and M is the memory depth of the encoder.

TABLE 7

| $T_1$: | | $t_1, \ldots, t_{M+1}$ = free; | $t_{M+2}, \ldots, t_{M+B} = 0$ |
|---|---|---|---|
| $T_2$: | | $t_1, \ldots, t_{M+1}$ = free; | $t_{M+2}, \ldots, t_{M+B} = 0$ |
| $T_3$: | $t_1 = 0$; | $t_2, \ldots, t_{M+2}$ = free; | $t_{M+3}, \ldots, t_{M+B} = 0$ |
| $T_k$: | $t_1, \ldots, t_{k-2} = 0$; | $t_{k-1}, \ldots, t_{M+k-1}$ = free; | $t_{M+k}, \ldots, t_{M+B} = 0$ |

When M=6 the code tap constraints are as set forth in Table 4 above.

Table 8 below sets forth the rules for the code tap constraints for the radix-2 first stage and radix-4 residual stages of a radix-2/radix-4 encoder.

TABLE 8

| $T_1$: | | $t_1, \ldots, t_{M+1}$ = free; | $t_{M+2}, \ldots, t_{M+B} = 0$ |
|---|---|---|---|
| $T_2$: | | $t_1, \ldots, t_{M+1}$ = free; | $t_{M+2}, \ldots, t_{M+B} = 0$ |
| $T_3$: | $t_1 = 0$; | $t_2, \ldots, t_{M+3}$ = free; | $t_{M+4}, \ldots, t_{M+B} = 0$ |
| $T_4$: | $t_1 = 0$; | $t_2, \ldots, t_{M+3}$ = free; | $t_{M+4}, \ldots, t_{M+B} = 0$ |
| $T_{2k-1}$: | $t_1, \ldots, t_{2k-3} = 0$; | $t_{2k-2}, \ldots, t_{M+2k-1}$ = free; | $t_{M+2k}, \ldots, t_{M+B} = 0$ |
| $T_{2k}$: | $t_1, \ldots, t_{2k-3} = 0$; | $t_{2k-2}, \ldots, t_{M+2k-1}$ = free; | $t_{M+2k}, \ldots, t_{M+B} = 0$ |

The constraints on the code taps for the radix-2/radix-4 approach are listed in Table 5 above when M=6.

The general rules for a rate R=B/(B+1) convolutional code are as follows.

1. Constraints on $T_1$ and $T_2$ are identical (2 coded bits). First M+X taps can be chosen freely. X depends on radix of first trellis sub-segment (radix-2: X=1; radix-4: X=2 etc.) All residual taps must be zero.

2. All following $T_k$ begin with Y zeros, where Y depends on the sum of radices of all previous trellis sub-segments. (radix-2: Y+=1; radix-4: Y+=2 etc.) The block of freely chosen M+X taps is shifted to the right by Y. The radix of the current trellis sub-segment determines X (radix-2: X=1; radix-4: X=2 etc.). All residual taps must be zero.

3. The amount of $T_k$ with identical constraints is identical with the number of coded bits of the current trellis sub-segment.

These rules can be generalized for an arbitrary convolutional code with rate R=B/C as follows.

1. The amount of code taps $T_k$ with identical constraints equals the number of coded bits of the considered trellis sub-segment.

2. (M+X) taps of each $T_k$ can be chosen freely, where M denotes the memory depth of the convolutional code and X equals the number of uncoded bits of the considered trellis sub-segment. The radix of the considered trellis sub-segment is $2^X$. (X=1: radix-2; X=2: radix-4; etc.)

3. First Y taps of each $T_k$ must be zero, where Y equals the sum of uncoded bits of all previous trellis sub-segments. (radix-2: Y+=1; radix-4: Y+=2 etc.) The block of freely chosen M+X taps is shifted to the right by Y.

4. Last Z taps of each $T_k$ must be zero, where Z=B−X−Y

Reference is again made to FIG. 8 and Table 5 to illustrate an example for those generalized rules. The second trellis sub-segment in FIG. 8 corresponds to two uncoded bits ($b_2$ and $b_3$) and two coded bits ($c_3$ and $c_4$). According to rule (1) there are two $T_k$ ($T_3$ and $T_4$) with identical constraints in Table 5. With memory depth M=6 in this example and with two uncoded bits ($b_2$ and $b_3$) in the second sub-segment M+X=6+2=8 taps of $T_3$ and $T_4$ can be chosen freely according to rule (2). According to rule (3), the first tap (Y=1) of $T_3$ and $T_4$ must be zero, as the single preceding trellis sub-segment corresponds to one uncoded bit ($b_1$). Finally, the last Z=B−X−Y=5−2−1=2 taps of $T_3$ and $T_4$ must be zero according to rule (4).

Figure 15:
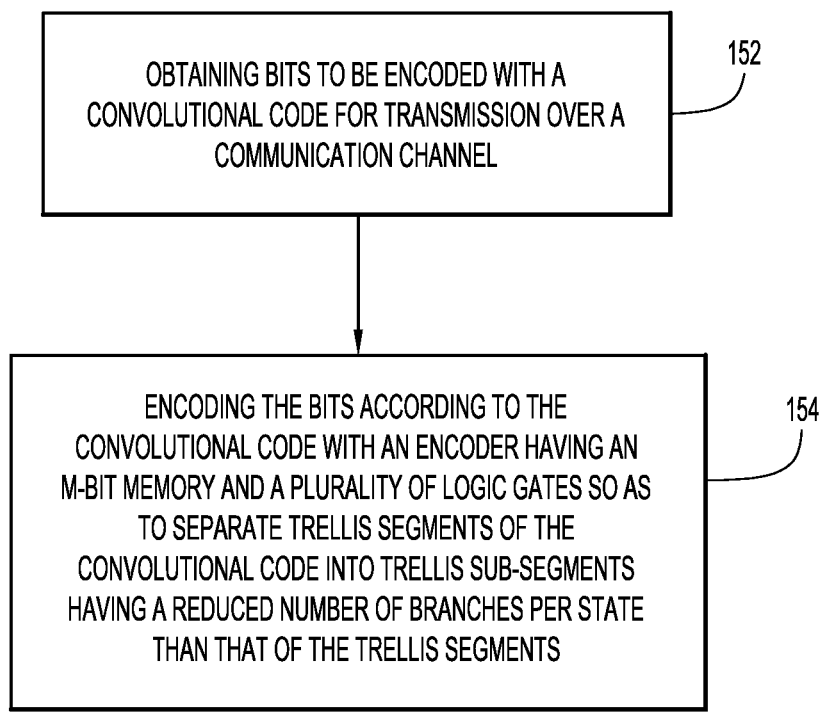
FIG. 15 is a flow chart depicting a process for encoding bits with a convolutional code so as to separate relatively highly connected trellis segments into sparsely connected trellis sub-segments, according to an example embodiment.

Reference is now made to FIG. 15. FIG. 15 illustrates a flow chart for an encoding method 150 according to an embodiment. At 152, bits to be encoded with a convolutional code are obtained for transmission over a communication channel. At 154, the bits are encoded according to the convolutional code with an encoder having an M-bit memory and a plurality of logic gates so as to separate trellis segments of the convolutional code into trellis sub-segments having a reduced number of branches per state than that of the trellis segments.

The encoding involves applying code taps that determine connections between bit positions of the M-bit memory and inputs to respective ones of the plurality of logic gates in order to produce the trellis sub-segments that connect a previous state to a next state through at least one intermediate state, and wherein outputs from respective ones of the plurality of logic gates correspond to coded bits of the convolutional code. In one embodiment, the code taps are selected and applied in order to produce trellis sub-segments that connect the previous state to a next state through a plurality of intermediate states. In another embodiment, the code taps are selected and applied such that a single uncoded bit results in a radix-2 trellis sub-segment and a group of X uncoded bits results in a radix-$2^X$ trellis sub-segment. The code taps may be selected and applied so as to separate trellis segments into only radix-2 trellis sub-segments, or in another form, the code taps may be selected and applied so as to separate trellis segments into a combination of various radix-$2^X$ trellis sub-segments, where X is greater than or equal to 1. The code taps may be selected and applied according to constraints which depend on the combination of radix-$2^X$ trellis sub-segments to be produced. In one embodiment, the constraints on the code taps define zero forcing of certain code taps to decouple certain coded bits from certain memory bits and uncoded bits.

Figure 16:
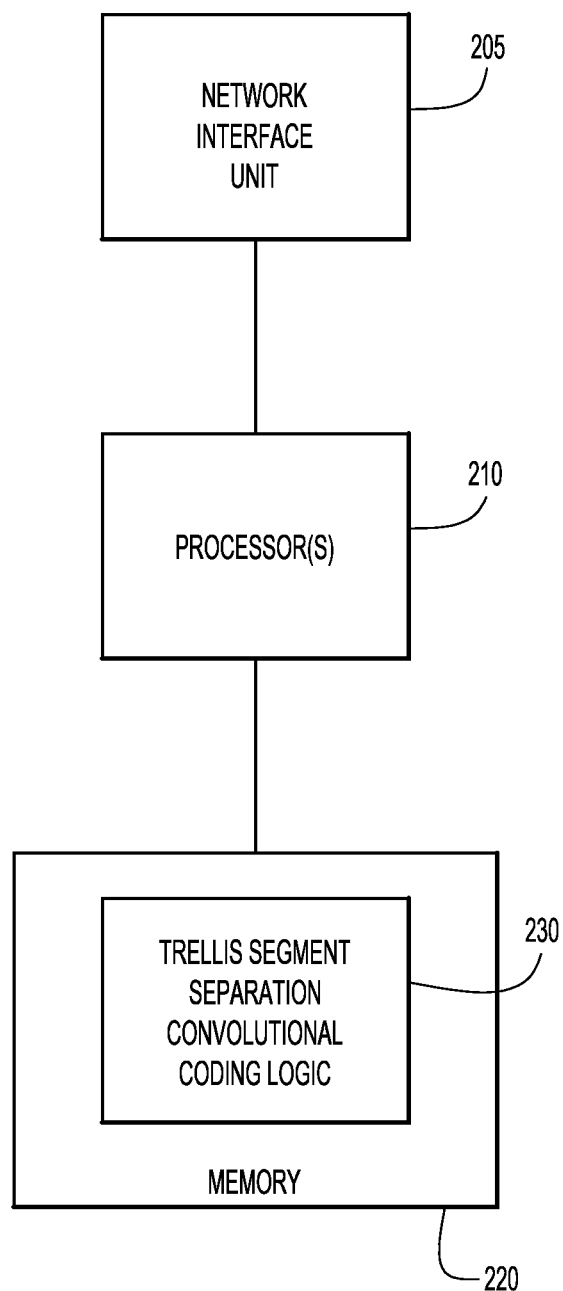
FIG. 16 is a block diagram of an apparatus in which the convolutional encoding techniques may be implemented by software executed in a computing platform, according to an example embodiment.

FIG. 16 illustrates a block diagram of a form of the trellis segment separation convolutional encoder in which the encoding operations are performed in software, rather than hardware. In this form, the encoder, shown at reference numeral 200, includes a network interface unit 205 that enables communications of a network (e.g., a wired or wireless network), a processor 210 and memory 220. The processor 210 may be a microprocessor or microcontroller, and there may be multiple instances of a processor. The memory 220 stores instructions for trellis segment separation convolutional coding logic 230 that, when executed by the processor 210, cause the processor to perform the techniques described herein in connection with FIGS. 1-8.

The memory 220 may include read only memory (ROM), random access memory (RAM), magnetic disk storage media devices, optical storage media devices, flash memory devices, electrical, optical, or other physical/tangible memory storage devices. Thus, in general, the memory 220 may comprise one or more tangible (non-transitory) computer readable storage media (e.g., a memory device) encoded with software comprising computer executable instructions and when the software is executed (by the processor 210) it is operable to perform the operations described herein.

To summarize, depending on certain constraints on the code taps of the convolutional code, a single (highly connected/high radix) trellis segment can be separated into several (more sparsely connected/low radix) sub-segments. This results in significant complexity reduction in branch metric units and path metric units of the Viterbi decoder for high rate convolutional codes. Simulations have shown that constraints on the code taps cause negligible performance penalty. Significant reduction of complexity and power dissipation of Viterbi decoding of high rate convolutional codes. For example, up to 75% less computational complexity for rate 5/6 can be achieved.

The techniques presented herein involve separating highly connected trellis segments into a plurality of sparsely connected trellis sub-segments (requiring certain constraints on the code taps), resulting in lower complexity Viterbi decoding of high rate convolutional codes. Viterbi decoding with trellis segment separation involves decoding of smaller subgroups of uncoded and coded bits per segment of the convolutional code. A single uncoded bit requires a radix-2 trellis sub-segment, and a group of N uncoded bits requires a radix-$2^X$ Trellis sub-segment. In some applications, sparsely connected sub-segments means that radix-2 and radix-4 segments are preferred.

The greatest computational complexity savings is when trellis separation is into solely radix-2 sub-segments. However, as presented herein, trellis segments can be separated into a mix of radix-$2^X$ sub-segments. This mix defines trade-off between computational complexity savings and increase in latency and hence additional buffering of received signals.

Constraints on the code taps means zero forcing of certain code taps to decouple certain coded bits from certain memory bits and uncoded bits allowing sub-segment wise Viterbi decoding. The constraints on the code taps depend on the mixture of radix-$2^X$ sub-segments In summary, in one form, a method is provided comprising: obtaining bits to be encoded with a convolutional code for transmission over a communication channel; and encoding the bits according to the convolutional code with an encoder having an M-bit memory and a plurality of logic gates so as to separate trellis segments of the convolutional code into trellis sub-segments having a reduced number of branches per state than that of the trellis segments.

In another form, an apparatus is provided comprising: an M-bit memory; a plurality of logic gates having a plurality of inputs coupled to respective ones of bit positions of the M-bit memory, outputs from respective ones of the plurality of logic gates corresponding to code bits of a convolutional code; and a plurality of code taps that determine connections between bit positions of the M-bit memory and inputs to respective ones of the plurality of logic gates so as to separate trellis segments of the convolutional code into trellis sub-segments having a reduced number of branches per state than that of the trellis segments.

In still another form, one or more non-transitory computer readable storage media encoded with instructions that, when executed by a processor, cause the processor to: obtain bits to be encoded with a convolutional code for transmission over a communication channel; and encode the bits according to the convolutional code using an M-bit memory and a plurality of logic functions so as to separate trellis segments of the convolutional code into trellis sub-segments having a reduced number of branches per state than that of the trellis segments.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A method comprising:
    encoding input bits into a convolutional code, the encoding including:
        providing an M-bit memory, wherein a trellis segment of the convolutional code determines a path from a current state to a next state of the M-bit memory;
        providing a plurality of logic gates and a plurality of code taps grouped into sets of code taps;
        applying, by each set of code taps, input bits from respective bit positions of the M-bit memory, and respective bit positions of the input bits, to inputs of a corresponding logic gate;
        producing from the input bits applied to the inputs of each logic gate a corresponding coded bit, the coded bits collectively representing the convolutional code;
        wherein constraints on the plurality of code taps define zero forcing of certain code taps to decouple certain coded bits from certain memory bits and input bits;
        wherein the applying includes, applying by the plurality of code taps, the input bits from the positions of the M-bit memory and the positions of the input bits to produce separation of the trellis segment of the convolutional code into trellis sub-segments defining paths from the current state to the next state of the M-bit memory through one of more intermediate states; and
        wherein the trellis sub-segments have fewer branches per state than the trellis segment, such that a number of digital logic circuits needed to decode the convolutional code that scales with the number of branches per state is fewer than a number of digital logic circuits needed to decode a convolutional code without the trellis sub-segments; and
    transmitting the convolutional code.

2. The method of claim 1, wherein applying comprises applying the input bits according to the code taps in order to produce trellis sub-segments that connect the current state to the next state through a plurality of intermediate states.

3. The method of claim 1, wherein applying comprises applying the input bits according to the code taps such that a single input bit results in a radix-2 trellis sub-segment and a group of X input bits results in a radix-$2^X$ trellis sub-segment.

4. The method of claim 3, wherein applying comprises applying the input bits according to the code taps so as to separate the trellis segment into only radix-2 trellis sub-segments.

5. The method of claim 3, wherein applying comprises applying the input bits according to the code taps so as to separate the trellis segment into a combination of various radix-$2^X$ trellis sub-segments, where X is greater than or equal to 1.

6. The method of claim 5, wherein further constraints on the plurality of code taps depend on the combination of radix-$2^X$ trellis sub-segments to be produced.

7. The method of claim 1, wherein the transmitting includes transmitting the convolutional code over a communication channel.

8. An apparatus comprising:
    an encoder to encode input bits into a convolutional code, the encoder including:
        an M-bit memory, wherein a trellis segment of the convolutional code determines a path from a current state to a next state of the M-bit memory; and
        a plurality of logic gates and a plurality of code taps grouped into sets of code taps,
        each set of code taps configured to apply input bits from respective bit positions of the M-bit memory, and respective bit positions of the input bits, to inputs of a corresponding logic gate;
        wherein each logic gate is configured to produce from the input bits applied to the inputs of the logic gate a corresponding coded bit, the coded bits collectively representing the convolutional code;
        wherein constraints on the plurality of code taps define zero forcing of certain code taps to decouple certain coded bits from certain memory bits and input bits;
        wherein the plurality of code taps are configured to apply the input bits from the positions of the M-bit memory and the positions of the input bits to produce separation of the trellis segment into trellis sub-segments defining paths from the current state to the next state of the M-bit memory through one of more intermediate states; and
        wherein the trellis sub-segments have fewer branches per state than that the trellis segment, such that a number of digital logic circuits needed to decode the convolutional code that scales with the number of branches per state is fewer than a number of digital logic circuits needed to decode a convolutional code without the trellis sub-segments; and
    wherein the encoder is configured to transmit the convolutional code.

9. The apparatus of claim 8, wherein the plurality of code taps are configured to apply the input bits to produce trellis sub-segments that connect the current state to the next state through a plurality of intermediate states.

10. The apparatus of claim 8, wherein the plurality of code taps are configured to apply the input bits such that a single input bit results in a radix-2 trellis sub-segment and a group of X input bits results in a radix-$2^X$ trellis sub-segment.

11. The apparatus of claim 10, wherein the plurality of code taps are configured to apply the input bits to separate the trellis segment into only radix-2 trellis sub-segments.

12. The apparatus of claim 11, wherein the plurality of code taps are configured to apply the input bits to separate the trellis segment into a combination of various radix-$2^X$ trellis sub-segments, where X is greater than or equal to 1.

13. The apparatus of claim 12, wherein further constraints on the plurality of code taps depend on the combination of radix-$2^X$ trellis sub-segments to be produced.

14. The apparatus of claim 8, wherein the encoder is configured to transmit the convolutional code over a communication channel.

15. One or more non-transitory computer readable storage media encoded with instructions that, when executed by a processor, cause the processor to:
    encode input bits into a convolutional code, using:
        an M-bit memory, wherein a trellis segment of the convolutional code determines a path from a current state to a next state of the M-bit memory; and
        a plurality of logic gates and a plurality of code taps grouped into sets of code taps;
    wherein the instructions to encode include instructions to cause the processor to:
        apply, by each set of code taps, input bits from respective bit positions of the M-bit memory, and respective bit positions of the input bits, to inputs of a corresponding logic gate;
        produce from the input bits applied to the inputs of each logic gate a corresponding coded bit, the coded bits collectively representing the convolutional code;

wherein constraints on the plurality of code taps define zero forcing of certain code taps to decouple certain coded bits from certain memory bits and input bits;

wherein the instructions to apply include instructions to apply, by the plurality of code taps, the input bits from the positions of the M-bit memory and the positions of the input bits to produce separation of the trellis segment of the convolutional code into trellis sub-segments defining paths from the current state to the next state of the M-bit memory through one of more intermediate states; and wherein the trellis sub-segments have fewer branches per state than the trellis segment, such that a number of digital logic circuits needed to decode the convolutional code that scales with the number of branches per state is fewer than a number of digital logic circuits needed to decode a convolutional code without the trellis sub-segments; and transmit the convolutional code.

16. The non-transitory computer readable storage media of claim 15, wherein the instructions to apply comprise instructions to apply the input bits according to the code taps so as to produce trellis sub-segments that connect the current state to the next state through a plurality of intermediate states.

17. The non-transitory computer readable storage media of claim 15, wherein the instructions to apply comprise instructions to apply the input bits according to the code taps such that a single input bit results in a radix-2 trellis sub-segment and a group of X input bits results in a radix-$2^X$ trellis sub-segment.

18. The non-transitory computer readable storage media of claim 17, wherein the instructions to apply comprise instructions to apply the input bits according to the code taps so as to separate the trellis segment into only radix-2 trellis sub-segments.

19. The non-transitory computer readable storage media of claim 17, wherein the instructions to apply comprise instructions to apply the input bits according to the code taps so as to separate the trellis segment into a combination of various radix-$2^X$ trellis sub-segments, where X is greater than or equal to 1.

20. The non-transitory computer readable storage media of claim 15, wherein the instructions to transmit include instructions to transmit the convolutional code over a communication channel.

21. The non-transitory computer readable storage media of claim 15, wherein further constraints on the plurality of code taps depend on a combination of radix-$2^X$ trellis sub-segments to be produced.

* * * * *